United States Patent

[11] 3,540,704

[72] Inventors Seiji Kami
Arleta;
Robert G. Wilson, Canoga Park; George R. Brewer, Malibu, California

[21] Appl. No. 765,214
[22] Filed Oct. 4, 1968
[45] Patented Nov. 17, 1970

[73] Assignee Hughes Aircraft Company
Culver City, California
a corporation of Delaware

[54] SEQUENTIAL SAMPLE CHANGING MECHANISM
15 Claims, 12 Drawing Figs.

[52] U.S. Cl. .......... 263/6
[51] Int. Cl. .......... F27b 9/14
[50] Field of Search .......... 263/6, 2

[56] References Cited
UNITED STATES PATENTS
3,027,149 3/1962 Fulton .......... 263/6

*Primary Examiner*—John J. Camby
*Attorneys*—James K. Haskell and Lewis B. Sternfels

ABSTRACT: Adapted specifically for repeatably reliable ion implantation techniques, the mechanism comprises a first reciprocating tray for supplying a plurality of stacked substrate wafers or samples for sequential implantation. A second reciprocating tray rests below the supply tray and receives a plurality of stacked, already implanted wafer arrays. A wafer moving arm sequentially moves a single wafer array from the supply tray to the receiver tray and this arm is actuated by an oscillating and reciprocating device which is timed to the reciprocation of the supply and receiver trays. A heating element adjacent the wafer moving arm permits gradual and uniform heating and cooling, respectively, of the supplied and received wafers.

INVENTORS.
SEIJI KAMI,
ROBERT G. WILSON,
GEORGE R. BREWER,
BY
[signature]
ATTORNEY.

SEQUENTIAL SAMPLE CHANGING MECHANISM

The present invention relates to a material handling mechanism for a plurality of samples, and more particularly, to such a mechanism for sequentially moving the samples through a plurality of positions.

The invention has particular use for the handling and feeding of semiconductor devices during fabrication thereof in order to increase the rate, efficiency and reproducibility of production and thereby to reduce the unit cost of fabrication. The mechanism stores, positions, transfers and uniformly and gradually heats and cools many wafers incorporating semiconductor device arrays specifically for ion implantation doping for each evacuation of the implantation system target chamber. It is to be understood, however, that the present invention is useful also to any other system which requires the handling, movement, heating, etc., of samples or specimens and is particularly useful for very small samples. Since the present invention was devised particularly for ion implantation doping techniques, emphasis will be on such techniques.

In an ion implantation system, an ion beam is generated, subjected to a plurality of beam handling processes, and impacted upon a heated target. To enable fabrication of semiconductor devices by ion implantation techniques, it is necessary to utilize an evacuated system having a vacuum in the neighborhood $10^{-6}$ Torr and to increase lattice vibration by heating the target. A typical technique in prior systems was to mount the various samples in suitable holders which were then mounted in position for implantation. The apparatus was then sealed and evacuated and the target heated. Thereafter, the wafers were implanted, the apparatus unsealed and the implanted wafers cooled and removed. A new wafer and holder were then placed in position for repetition of the implantation process.

Because of the slowness of this procedure, other prior systems utilized multiple sample holders for rotating the wafers within a special target chamber so that several implantations of these wafers could be effected without the necessity of a corresponding number of target changes within the chamber. Nevertheless, these multiple target holding systems were still limited in the number of wafers that could be handled per pumpdown, that is, per each evacuation of the ion implantation system. Generally, the wafers were mounted on the periphery of a multiple sided holder which was supported on a shaft. The shaft could be rotated so that the desired wafer would be aligned with the axis of an ion beam. However, with a multiple sided holder, the diameter thereof would increase as the number of sides increased, thus creating problems in container support size and design.

The present invention overcomes these and other problems by providing a sequential changing mechanism which provides a small increase in target chamber volume for each additional wafer implanted during a given target chamber evacuation. Fifty wafers, each approximately having a 1 and one-eighth inch diameter, can be contained in a cylindrical chamber of approximately a size of 6 inches in diameter by 9 to 12 inches long. For additional wafers, only the chamber length need be increased and, as a further example, an additional 50 wafers would require only approximately 6 additional inches.

A heating element is used to heat a forward wafer and, as the wafers are sequentially changed, each forward moving wafer is further heated while each rearward moving wafer is slowly cooled. This progressive heating and cooling is uniform and gradual and, in some cases, may be necessary, such as when rapid heating or cooling deleteriously affects the wafer.

The changing mechanism is also so structured as to provide precise positioning of all wafers, thus assuring the same positioning for each specimen. It is possible, therefore, to accurately reproduce the same work for all implanted wafers.

To accomplish these objectives, the present invention utilizes a pair of trays, one of which supplies the wafers for implantation and the other of which receives the implanted wafers. The supply tray is mounted along the axis of the ion beam so that the front or forward wafer is directly in line with the axis of the ion beam. After this wafer has been implanted, it is moved downwardly into the receiver tray so that the next wafer in the supply tray is positioned in readiness for implantation. The mechanism of the preferred embodiment of the present invention reciprocates the supply tray and the receiver tray to aid in wafer movement, reciprocates and pivots a drive arm to move an implanted wafer from the supply tray to the receiver tray, and utilizes a rachet mechanism used in conjunction with the receiver tray to provide space therein for the reception of the implanted wafer.

It is, therefore, an object of the present invention to provide a means by which large numbers of samples may be sequentially stored, placed in position for work thereon, and stored after the work has been completed.

Another object is the provision of such a means for obtaining a repeatability of sample positioning for reproducible work.

Another object is the provision of such a means for handling small sized samples.

A further object is to provide such a means for controlled uniform heating and cooling of samples.

Other aims and objects as well as a more complete understanding of the present invention will appear from the following explanation of an exemplary embodiment and the accompanying drawing thereof in which.

Figures 6, 8:
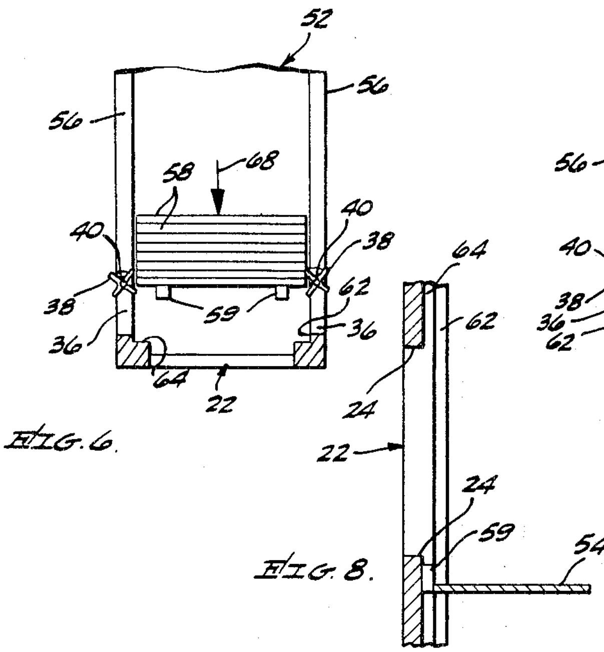
FIG. 6 is a top view of the receiver tray and ratchet gear mechanism of FIG. 1 in retracted position.
Figure 7:
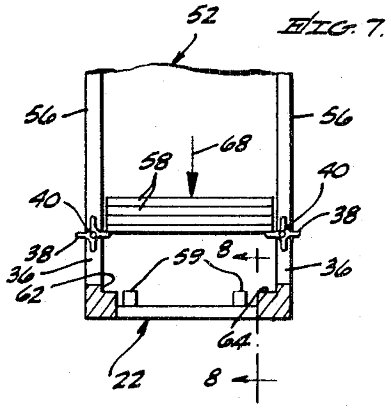
FIG. 7 is a partial top view of the receiver tray and ratchet gear of FIG. 1 in extended position.

FIG. 8 is a partial side view of the receiver tray taken along lines 8–8 of FIG. 7; and FIGS. 9—12 are schematic drawings showing the target changing mechanism in four different operative positions. For illustrative purposes, the axial and radial cams have been separated, the axial cam has been depicted in radial form, and the movements of the drive arm and holder guide plate have been separately drawn.

Accordingly, with reference to FIGS. 1—5, a target changing mechanism 20 includes a fixed holder guide plate 22 having a window 24 to permit entry of an ion beam 26. A recess 62 is provided in plate 22 to form tracks 64 on both sides of window 24 the purpose of which tracks will be shortly described. Two pairs of ears 28 are formed integrally on the sides of guide plate 22 and support upper and lower sets 30 and 32 of bushing shafts. Similar ears and upper and lower sets are formed at the other end of mechanism 20, only upper set 30' being illustrated. Disposed between upper and lower ears 28 on both sides of the guide plate are a pair of ratchet gear holders 34. Each holder 34 is provided with spaced extending arms 36 between which a pair of ratchet gears 38 are rotatably held by means of pins 40. Each gear 38 is equipped with a one-way ratchet mechanism so that they can rotate in but a single direction.

A supply tray 42 having a bottom 44 and upstanding sides 46 is disposed to receive a plurality of holders 48 which support wafers and which are stacked in position for ion implantation. A pair of bushings 50 and 50' are secured to the sides 46 of tray 42 at both ends thereof and are disposed to receive bushing shafts 30 and 30' for reciprocation with respect to holder guide plate 22.

A receiver tray 52 having a bottom 54 and a pair of upstanding sides 56 is disposed to receive a plurality of wafers and holders 58 which have already undergone an ion implantation process. Tray 52 is made as long as tray 42. A pair of stops or fingers 59 (see FIGS. 6, 7 and 8) extend from bottom 54 and are disposed to contact wafer holders 58. As described hereinafter, fingers 59 cooperate with ratchet gears 38. A pair of bushings 60 are secured to sides 56 and receive bushing shafts 32 to permit reciprocation of receiver tray 52 with respect to fixed holder guide plate 22. A pair of bushings and shafts similar to bushings 50′ and shafts 30′ of tray 42 are also provided at the end of tray 52 to provide stability; however, these have not been shown to facilitate illustration and because of space limitations.

Holders 48 when abutted against guide plate 22, fit within recess 62 of the guide plate and are moveable therealong on tracks 64 in such a manner that the recess acts as a holder guide. Each holder 48, after having been implanted, can therefore be slid from supply tray 42 into receiver tray 52 along the tracks at which point holder 48 becomes holder 58. The implanted wafer from the supply tray is permitted to be received within tray 52 by means of the holding action of ratchet gears 38. As shown in FIG. 6, receiver tray 52 is retracted from plate 22 so that fingers 59 and ratchet gears 38 hold wafer holders 58 away from the guide plate. When tray 52 and fingers 59 move toward plate 22, as shown in FIG. 7, gears 38 prevent movement of the wafer holders in order to provide space for the next holder to be slid along recess 62 and into the space.

A pair of springs 66 and 68, oppositely disposed from guide plate 22, are rotatably held respectively within a pair of brackets 70 and 72 which, in turn, are secured to plates 74 and 76. The plates respectively bear against holders 48 and 58. The other end of springs 66 and 68 are respectively secured to bottoms 44 and 54 of trays 42 and 52 adjacent bushings 50 and 60.

A right angled plate 78 (see FIGS. 1 and 3) having a drive arm 80 is reciprocally and pivotally mounted on a fixed shaft 82 by means of bushings 84. Drive arm 80 is received and moveable within slots 86 and 87 (see also FIG. 2) of guide plate 22. Plate 78 and drive arm 80 are reciprocated by means of a crank 88 and a link 90. Crank 88 is rotatably secured to a drive shaft 92 while link 90 is secured to one or both bushings 84 by a shaft 94. Therefore, as shaft 92 and crank 88 rotate in unison, link 90 is caused to follow and reciprocates plate 78 and drive arm 80.

Figures 1, 4, 5:
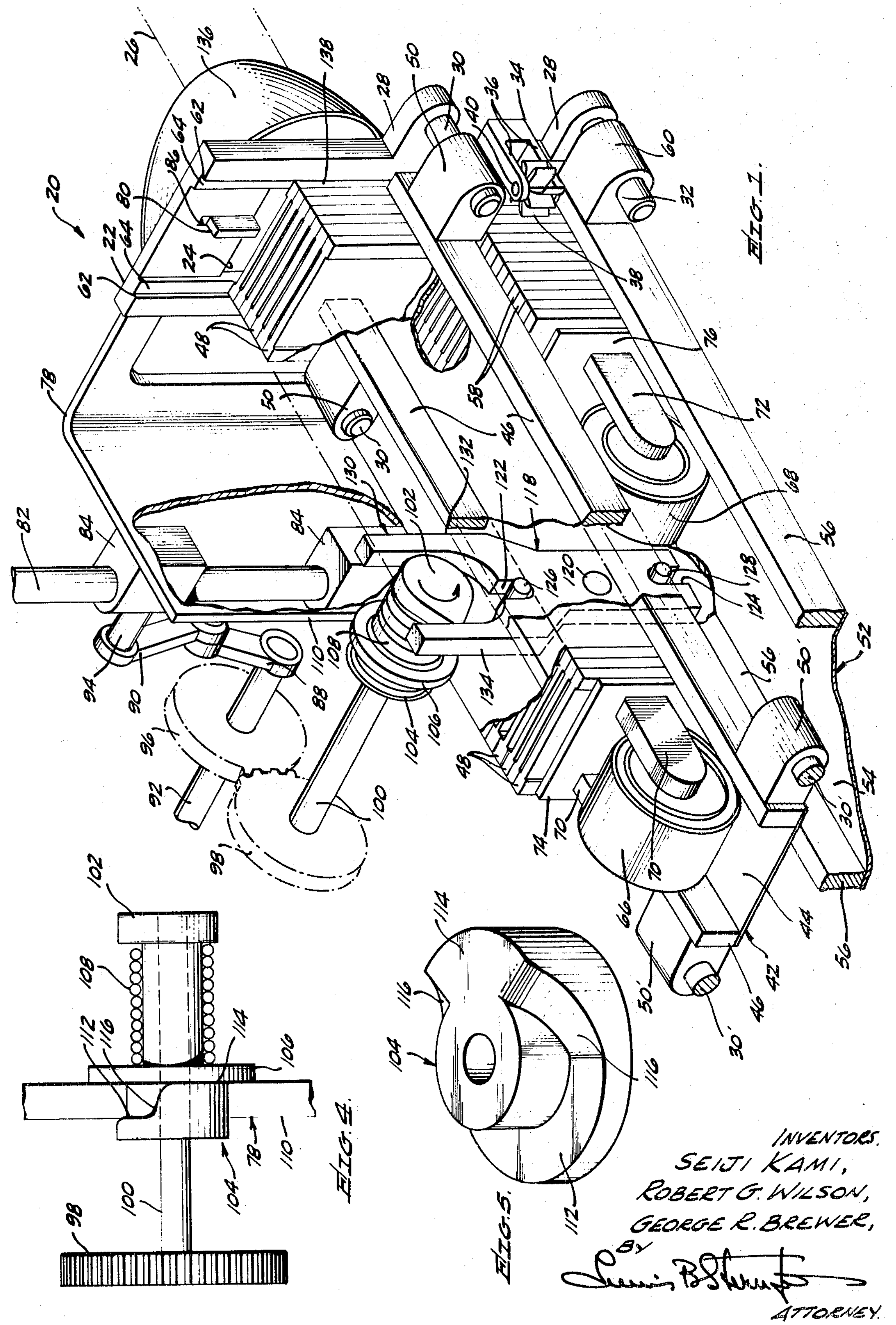
FIG. 1 is a perspective view of the preferred embodiment of the present invention.
FIG. 4 is a side view, partly in section, depicting the axial cam and radial cam assembly of FIG. 1.
FIG. 5 is a perspective view of the axial cam of FIGS. 1 and 4.
Figure 2:
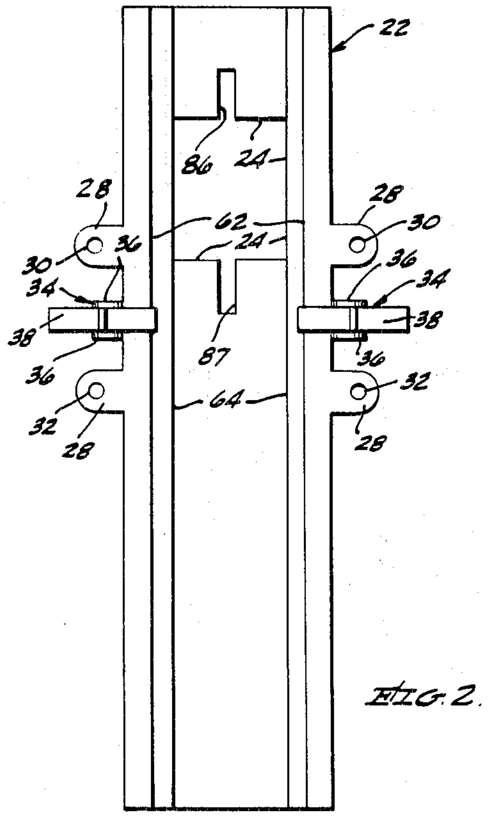
FIG. 2 is a front elevational view of the window and holder guide plate of FIG. 1.
Figure 3:
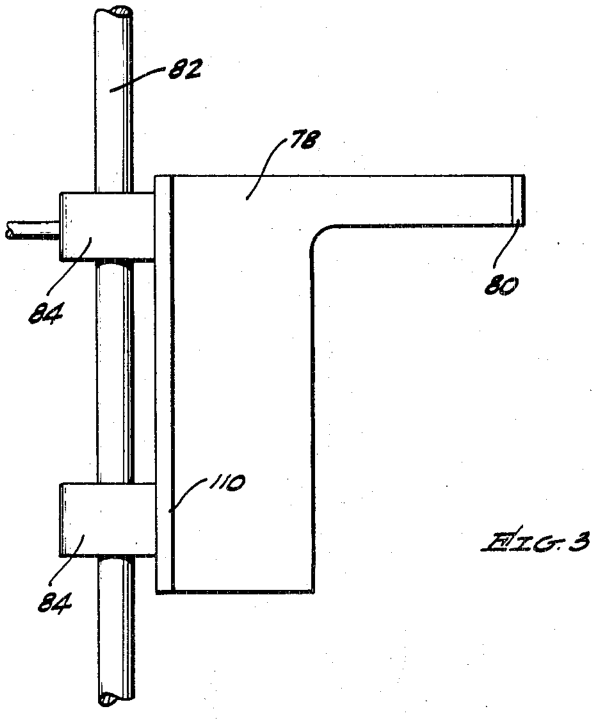
FIG. 3 is a side elevational view of the holder drive arm plate of FIG. 1 as secured to the drive arm plate shaft.

A gear 96 is also affixed to shaft 92 and meshes with a gear 98 secured to a shaft 100. As shown in FIGS. 1, 4 and 5, a radial cam 102 and an axial cam 104 are secured to shaft 100 for rotation therewith. A bearing plate 106 is also placed on shaft 100 and a spring 108 is placed between radial cam 102 and bearing plate 106 to bias the bearing plate against axial cam 104. An edge 110 of plate 78 is positioned between axial cam 104 and bearing plate 106 in order to maintain contact of edge 110 with cam 104.

Cam 104 is provided with axially spaced faces or lands 112 and 114 which are connected by sloping surfaces 116. Therefore, as cam 104 rotates, edge 110 of plate 78 is caused to move from one land 112 to the other land 114 and vice versa, thereby causing plate 78 and drive arm 80 to pivot and oscillate about shaft 82.

A follower 118 (see FIG. 1) is pivoted about a fixed shaft 120 and is provided with a pair of slots 122 and 124. Two pins 126 and 128 are affixed to respective sides 46 and 56 of supply tray 42 and receiver tray 52 and are received respectively within slots 122 and 124. A yoke 130 having arms or times 132 and 134 is formed at one end of follower 118.

A wafer heater 136 is affixed to holder guide plate 22 for gradual and uniform heating of the wafers placed in wafer holders 48.

Figure 9:
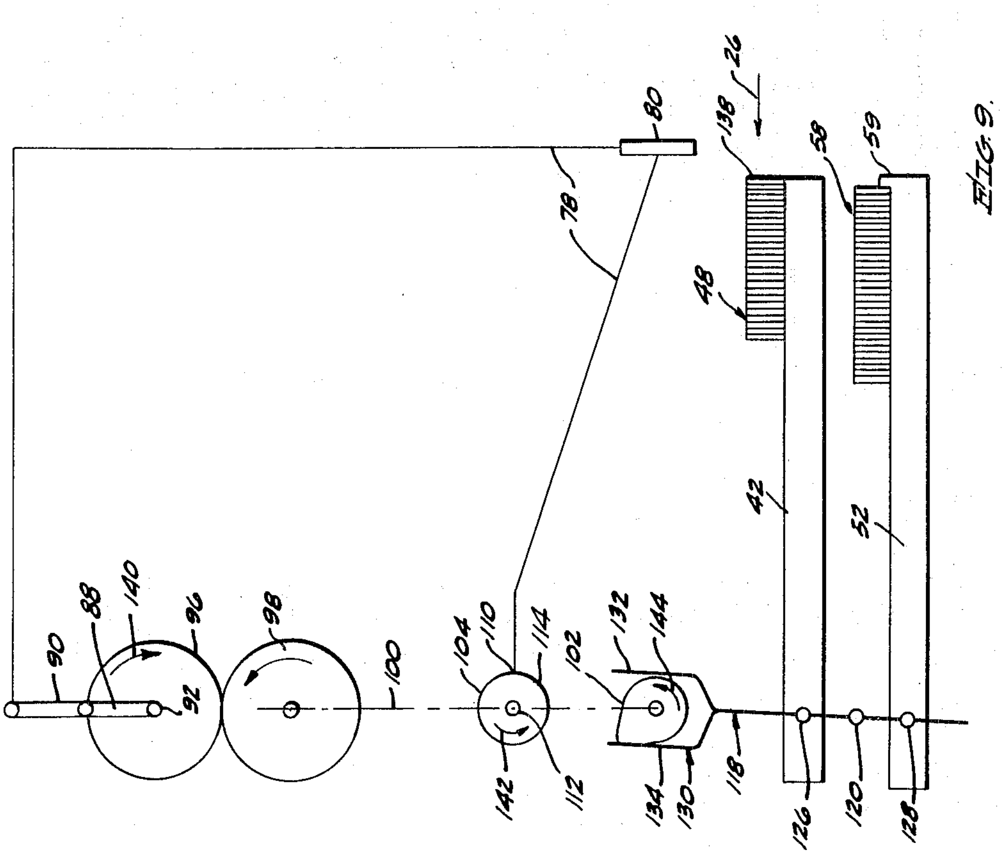

The operation of the invention may be most easily understood with reference to FIGS. 1 and 9—12. The cycle is assumed, for illustrative purposes, to be at that point where a forward wafer 138 is in position in readiness for ion implantation. This position is depicted in FIG. 9 wherein supply tray 42 is fully extended toward and abuts guide plate 22 as to support wafer 138 at its bottom. At the same time, receiver tray 52 is fully retracted from the guide plate wherein stops 59 have pulled formerly implanted wafers 58 rearwardly. In this position, yoke 130 of follower 118 is inclined forwardly and drive arm 80 is retracted and at its fullest height so as not to interfere with the flow of ions from ion beam 26. In this position of arm 80, crank 88 and link 90 are fully extended in a vertical direction. Edge 110 of plate 78 rests against face 114 of axial cam 104 in order to provide the retraction of drive arm 80. Radial cam 102 is in position to pivot follower 118.

Figure 10:
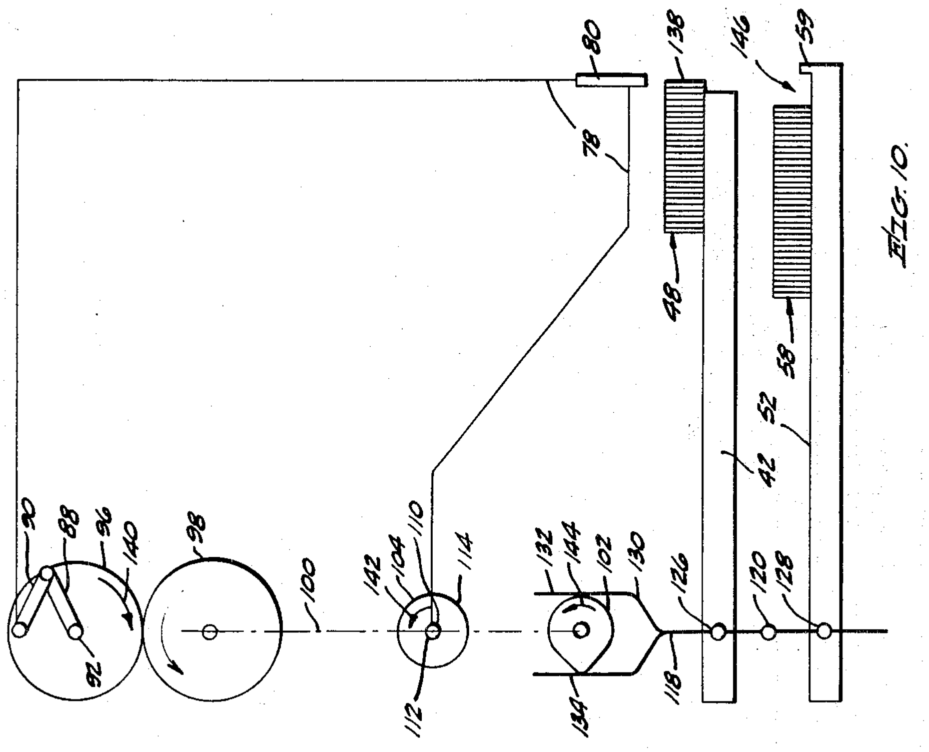

After the implantation process has been accomplished, drive shaft 92 rotates a sufficient amount, for illustrative purposes 60°, as shown by arrow 140, thereby moving drive arm 80 downwardly and, in the meantime, axial cam 104 has rotated in the direction of arrow 142 so that edge 110 of plate 78 has moved onto face or land 112 of the axial cam. Therefore, drive arm 80 is positioned above recently implanted wafer 138 as depicted in FIG. 10. Furthermore, radial cam 102 has rotated in the direction of arrow 144 to pivot follower 118, thereby causing supply tray 42 to move rearwardly and to cause receiver tray 52 to extend in position to receive the recently implanted wafer. Because of the holding action of ratchet gears 38, previously implanted wafers 58 are held away from fingers 59 during the extension of tray 52 so as to provide a space 146 for reception of implanted wafer 138 between wafers 58 and the fingers of the receiver tray. Wafer 138 is free from the forward edge of tray 42 but does not fall because of the bias exerted by spring 66 to hold the wafer against plate 22.

Figure 11:
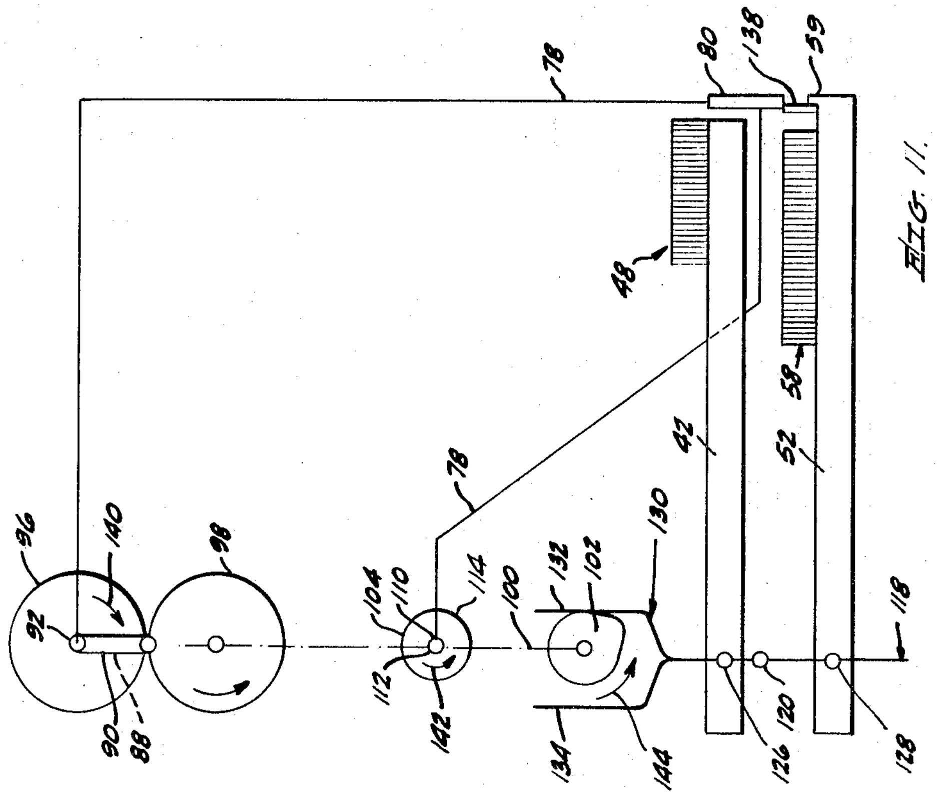

With a further rotation, for example, of 120°, as depicted in FIG. 11, crank 88 has caused link 90 to move plate 78 and driver arm 80 fully downwardly, thereby sliding recently implanted wafer 138 along tracks 64 of guide plate 22 and securely within receiver tray 52. During movement of arm 80 and wafer 138, trays 42 and 52 do not move since radial cam 102 has moved from arm 134 to arm 132 of follower 118.

Figure 12:
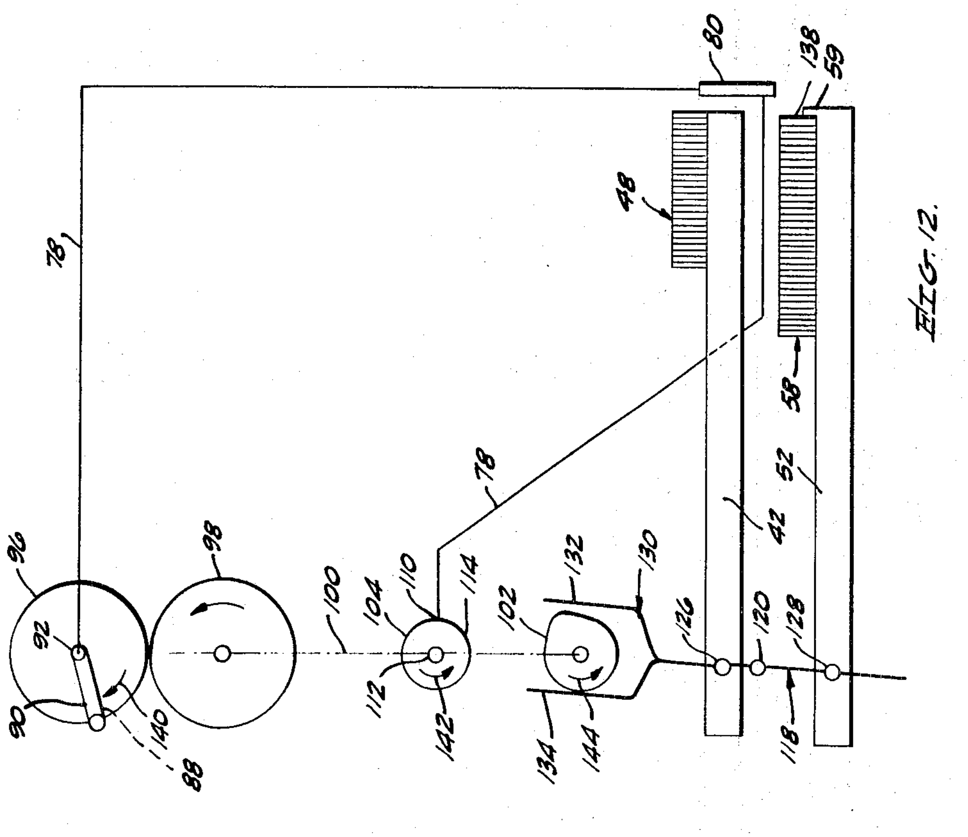

A further 60° rotation of driver shaft 92, as shown in FIG. 12, retracts drive arm 80 as axial cam 104 moves edge 110 of plate 78 from land 112 to land 114 of the axial cam. Radial cam 102 also pivots follower 118 as it bears against arm 132 to retract tray 52 from and to extend tray 42 toward plate 22. Retraction of tray 52 causes fingers 59 to move formerly implanted wafers 58 and recently implanted wafer 138 rearwardly as a unit therewith and also causes ratchet gears 38 to rotate past a detent with the wafers.

A further 120° rotation of drive shaft 92 and gear 96 repositions crank 88 and link 90 in their full upward position as depicted in FIG. 9 wherein the next wafer in supply tray 42 is positioned by spring 66 against holder guide plate 22 for implantation.

Although the invention has been described with reference to a particular embodiment thereof, it should be realized that various changes and modifications may be made therein without departing from the spirit and scope of the invention.

We claim:

1. A sequential sample changing mechanism comprising:
 supply means for samples;
 receiver means for reception of the samples from said supply means; and
 a combined reciprocating and oscillating apparatus sequentially contactable with the samples to move the samples from said supply means to said receiver means, the invention comprising: said apparatus including a stationary shaft, a plate pivotally and reciprocally connected to said shaft and provided with a drive arm sequentially contactable with the samples, a rotatable crank and link assembly connected to said plate for reciprocation thereof, a rotatable axial cam bearing against and edge of said plate for oscillation thereof, a radial cam rotatable with said axial cam, a pivotal follower having a yoke positioned about said radial cam and connected to said supply and receiver means for simultaneous reciprocation thereof in opposite directions, whereby said supply means is retracted and said receiver means is extended when said drive arm contacts one of the samples for movement thereof from said supply means to said receiver means.

2. A mechanism as in claim 1 further including a one way ratchet contactable with the samples in said receiver means to provide space in said receiver means for reception of said one of the samples.

3. A sequential sample changing mechanism comprising:
supply means for samples;
receiver means for reception of the samples from said supply means; and
a combined reciprocating and oscillating apparatus sequentially contactable with the samples to move the samples from said supply means to said receiver means, the invention comprising: a reciprocator for moving said supply means and said receiver means in opposite directions, said reciprocator connected to said reciprocating and oscillating apparatus for interdependent operation of said reciprocator and said apparatus.

4. A mechanism as in claim 3 wherein said reciprocator includes a pivoted follower having pinned connections to said supply and receiver means and a radial cam bearing against said follower.

5. A sequential sample changing mechanism comprising:
supply means for samples;
receiver means for reception of the samples from said supply means; and
a combined reciprocating and oscillating apparatus sequentially contactable with the samples to move the samples from said supply means to said receiver means, the invention comprising: said apparatus including a drive arm contactable with and retractable from each of the samples and a crank and link assembly connected to said drive arm for reciprocation thereof.

6. A sequential sample changing mechanism comprising:
supply means for samples;
receiver means for reception of the samples from said supply means; and
a combined reciprocating and oscillating apparatus sequentially contactable with the samples to move the samples from said supply means to said receiver means, the invention comprising: a drive arm contactable with and retractable from each of the samples and an axial cam connected to said drive arm for oscillation thereof.

7. A mechanism as in claim 6 further including a plate bearing against said drive arm for maintaining contact thereof with said axial cam.

8. A mechanism as in claim 6 wherein said reciprocating and oscillating apparatus further includes a crank and link assembly connected to said drive arm for reciprocation thereof.

9. A mechanism as in claim 6 further including a reciprocator including a pivoted follower having pinned connections to said supply and receiver means and a radial cam bearing against said follower, said radial cam and said axial cam mounted on a shaft for rotation together.

10. A mechanism for periodically positioning a specimen in a first position and moving the specimen from the first position to a second position comprising:
a specimen supply means holding the specimen in the first position;
a specimen receiver means for holding the specimen in the second position; and
an apparatus having:
an element for periodically contacting and moving the specimen from the first position to the second position; and
an assembly connected to said specimen supply means and said specimen receiver means for periodic reciprocation of said supply and receiver means in timed relation with said element, whereby said supply means is extended to support the specimen in the first position and said receiver means is retracted when said element is retracted from the specimen; and whereby said supply means is retracted from the specimen and said receiver means is extended for reception of the specimen when said element is in extended and in contact with the specimen.

11. A mechanism as in claim 10 wherein said apparatus further comprises a rotatable actuator having means for periodically reciprocating said specimen contacting element and for periodically oscillating said contacting element.

12. A mechanism as in claim 11 wherein said supply and receiver means reciprocation assembly comprises a cam rotatably connected to said actuator and a follower pivotally secured to said supply and receiver means.

13. A mechanism as in claim 12 further including biasing means secured to said supply means and to said receiver means for exerting a force against the specimen.

14. A mechanism as in claim 10 further including a retainer on said receiver means and a ratchet positioned adjacent to said retainer and cooperable with said receiver means and the specimen for providing a space in said receiver means when said receiver means is extended.

15. A mechanism as defined in claim 10, further including heating means positioned adjacent the specimens for gradual and uniform consecutive heating and cooling of the specimens.